(12) United States Patent
Yao et al.

(10) Patent No.: US 6,277,198 B1
(45) Date of Patent: *Aug. 21, 2001

(54) USE OF TAPERED SHADOW CLAMP RING TO PROVIDE IMPROVED PHYSICAL VAPOR DEPOSITION SYSTEM

(75) Inventors: Tse-Yong Yao, San Francisco; Allen Thompson, San Carlos; Peijun Ding; Richard Hong, both of San Jose, all of CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/326,395

(22) Filed: Jun. 4, 1999

(51) Int. Cl.[7] .......................... B05C 13/00; B05C 13/02; B05C 21/00
(52) U.S. Cl. .................. 118/503; 118/500; 204/298.15; 156/345; 24/570
(58) Field of Search ................ 204/298.11, 298.15; 156/345, 345 PW, 345 WH; 118/500, 503; 24/570; 248/376.1

(56) References Cited

U.S. PATENT DOCUMENTS

| | | | |
|---|---|---|---|
| 4,458,746 | 7/1984 | Holden et al. | 165/80 A |
| 4,473,455 | 9/1984 | Dean et al. | 204/298 |
| 4,978,412 | 12/1990 | Aoki et al. | 156/345 |
| 5,119,761 | 6/1992 | Nakata | 118/725 |
| 5,228,501 | 7/1993 | Tepman et al. | 165/80.1 |
| 5,262,029 | 11/1993 | Erskine et al. | 204/298.15 |
| 5,292,399 | 3/1994 | Lee et al. | 156/643 |
| 5,316,278 | 5/1994 | Sherstinsky et al. | 269/254 R |
| 5,326,725 | 7/1994 | Sherstinsky et al. | 437/225 |
| 5,328,722 | 7/1994 | Ghanayem et al. | 427/250 |
| 5,352,294 | 10/1994 | White et al. | 118/725 |
| 5,376,180 | 12/1994 | Mahler | 118/728 |
| 5,403,459 | 4/1995 | Guo | 204/192.32 |
| 5,421,401 | 6/1995 | Sherstinsky et al. | 165/80.2 |

(List continued on next page.)

FOREIGN PATENT DOCUMENTS

| | | | |
|---|---|---|---|
| 0343502A2 | 11/1989 | (EP) | H01L/21/00 |
| 0343502A3 | 11/1989 | (EP) | H01L/21/00 |
| 0489439A1 | 6/1992 | (EP) | C23C/16/44 |
| 0595307A2 | 5/1994 | (EP) | H01L/21/00 |
| 0595307A3 | 5/1994 | (EP) | H01L/21/00 |
| 0598362A1 | 5/1994 | (EP) | C23C/14/50 |
| 0650181A2 | 4/1995 | (EP) | H01J/37/20 |
| 5-33119 | 2/1993 | (JP) | C23C/8/26 |
| WO 95/04373 | 2/1995 | (WO) | H01L/21/68 |

OTHER PUBLICATIONS

Austrian Search Report dated Oct. 21, 1998.
IBM Technical Disclosure Bulletin, vol. 31, No. 7, Dec. 1998, pp. 139–140.

Primary Examiner—Nam Nguyen
Assistant Examiner—Steven H. Ver Steeg
(74) Attorney, Agent, or Firm—Thomason, Moser & Patterson, LLP (57) ABSTRACT

A method and apparatus is provided for clamping and shielding the edge of a substrate useful in electronic device fabrication. A shadow ring is formed by an inward radial extension of the top surface of a generally annular shaped clamp ring. The shadow ring portion overhangs but does not contact the top surface of a substrate being processed. A smoothly tapered substrate contact surface extending from the outer diametrical extent of the shadow ring bottom surface to the bottom surface of the clamp ring is sized and adapted to engage the outer edge of a substrate. The substrate contact surface aligns the clamp ring to a substrate support member and a substrate to the substrate support member and the clamp ring as the substrate is lifted vertically.

23 Claims, 4 Drawing Sheets

U.S. PATENT DOCUMENTS

| | | | |
|---|---|---|---|
| 5,437,757 | 8/1995 | Rice et al. | 156/345 |
| 5,439,524 | 8/1995 | Cain et al. | 118/723 E |
| 5,447,570 | 9/1995 | Schmitz et al. | 118/728 |
| 5,456,756 | 10/1995 | Ramaswami et al. | 118/721 |
| 5,460,703 | 10/1995 | Nulman et al. | 204/192.2 |
| 5,534,110 | 7/1996 | Lenz et al. | 156/643.1 |
| 5,540,821 | 7/1996 | Tepman | 204/192.13 |
| 5,632,873 | 5/1997 | Stevens et al. | 204/298.15 |
| 5,725,718 | 3/1998 | Banholzer et al. | 156/345 |
| 5,810,931 | 9/1998 | Stevens et al. | 118/721 |
| 5,851,299 * | 12/1998 | Cheng et al. | 118/729 |
| 5,860,640 | 1/1999 | Marohl et al. | 269/289 R |
| 6,051,122 * | 4/2000 | Flanigan | 204/298.11 |

* cited by examiner

USE OF TAPERED SHADOW CLAMP RING TO PROVIDE IMPROVED PHYSICAL VAPOR DEPOSITION SYSTEM

FIELD OF THE INVENTION

The present invention relates generally to improvements in semiconductor processing equipment. More particularly, the invention relates to methods and apparatus for clamping and shielding the edge of a substrate with minimal edge exclusion.

BACKGROUND OF THE RELATED ART

The fabrication of semiconductor devices on substrates typically requires the deposition of multiple metal, dielectric and semiconductive layers on the surface of substrates. These layers are typically deposited onto substrates in vacuum processing chambers. Some processing operations may require the deposition of additional layers while others may require the etching, or partial removal, of a previously deposited film layer.

One commonly used vacuum deposition process is physical vapor deposition (PVD), also referred to as sputtering. In a typical PVD process, a target comprised of the desired deposition material is exposed to a plasma and bombarded by ions from the plasma. This bombardment causes atoms or larger particles to be sputtered from the target and deposited on the substrate being processed. Typically in PVD processes, the geometry of the chamber and the spacing of the target from the substrate being processed is important in order to control the even distribution of the target material onto the substrate.

During processing, a substrate support member, often referred to as a pedestal, susceptor, or heater, is disposed in the processing chamber to support the substrate. A clamp ring is typically supported in the chamber above the support member on a shield. When a substrate is introduced into the chamber and supported on the support member, the support member and substrate are moved in the chamber relative to the clamp ring to pick up the clamp ring so that the clamp ring contacts the edge of the substrate and holds the substrate on the support member. As a result of the contact of the clamp ring with the edge of the substrate, the clamp ring shields the edge of the substrate from deposition material, thereby minimizing the usable area on the surface of the substrate.

Clamp rings have been provided having a seat portion which engages the top surface of the substrate and an overhanging roof portion which does not contact the top portion of the substrate. The purpose of the roof portion in some applications is to shield the edge of the substrate from deposition. The roof is typically spaced from the upper surface of the substrate to prevent deposition material from being deposited at points where the clamp ring contacts the substrate. If deposition material deposits at these contact points, the substrate can adhere to the clamp ring following deposition which can lead to other difficulties including particle generation or even system shut down to remove the substrate.

Figure 2:
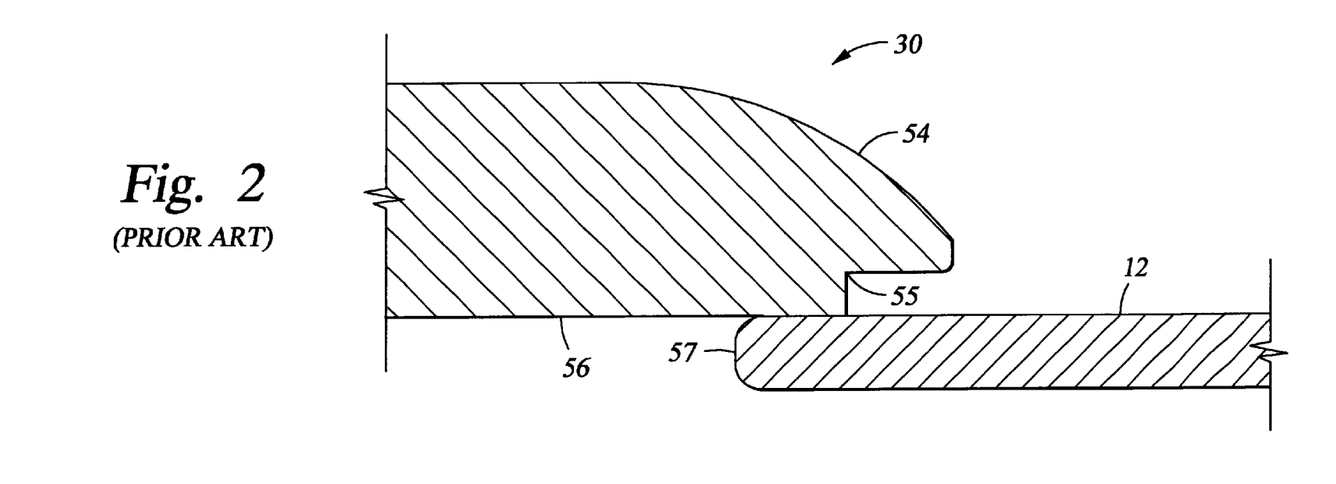
FIG. 2 is a partial cross sectional view showing a typical prior art clamp ring.

Clamp rings are generally formed as a continuous annular shaped member or an interrupted metal ring. As shown in FIG. 2, part of the ring 56 engages the substrate surface and exerts a downward force on the top, outer edge of the substrate 12 which is positioned on the support member. The weight of the clamp ring 30 holds the substrate in position for processing and assists in preventing substrate warpage. The fact that the clamp ring contacts the top surface of the substrate presents several problems. First, as previously mentioned, the clamp ring is likely to receive material deposits thereon as deposition processes are performed. This can cause adherence of the substrate to the clamp ring. Such adherence can hinder the removal of the substrate from the chamber following processing. Secondly, the clamp ring seat or contacting portion 56 shields a portion of the outer perimeter of the substrate surface. This reduces the useable surface area of the substrate on which electronic devices may be formed. This problem is generally referred to as edge exclusion.

Much effort has been directed at developing clamp rings that shield the edge of the substrate and control or prevent sticking of substrates to the clamp ring without the loss of excess usable surface area on the substrate. Typically, clamp rings adequately secure the substrate to the support member, but achieve this holding force at the expense of the outer perimeter of the substrate.

The trend in metallization is to provide as much coverage on the substrate surface as possible. This can be seen in full coverage deposition systems which do not utilize clamp rings or shadow rings during deposition. Further, the trend is to utilize copper as the material of choice in metallization and electroplating as the process of choice to deposit copper. However, copper deposited on the beveled edge of a substrate tends to flake or peel off during chemical mechanical polishing. As a result, edge exclusion has continued to be a requirement of some deposition schemes.

As shown in FIG. 2, one common approach to edge exclusion has involved extending the clamp ring across the gap between the edge of the substrate and the edge of the support member and forming a lip or seat extending over the edge of the substrate. Attempts to minimize loss of usable surface area have also required moving the inner terminus of the clamp ring lip which overhangs the edge of the substrate outwardly to more closely approach the edge of the substrate. To maintain a good aspect ratio (ratio of lip overhang width to height above the substrate) to minimize loss of usable surface area on the substrate has proven difficult. One successful approach in this regard is disclosed in U.S. Pat. No. 5,810,931 which is assigned to the assignee of the present invention and incorporated herein by reference.

Therefore, it would be desirable to provide a clamp ring which minimizes edge exclusion (maximizes die area) and also prevents copper (or other) metal deposition on the substrate backside and on the substrate bevel.

SUMMARY OF THE INVENTION

The present invention generally provides a clamp ring having a tapered seat design to secure the substrate to a supporting surface. The tapered surface of the clamp ring preferably aligns the clamp ring and the substrate to each other as well as to the supporting surface.

In one aspect of the invention, the clamp ring includes a lower tapered surface which rests on an edge of a substrate, such as a beveled edge of a substrate, during processing. The upper surface of the clamp ring forms an inner lip of the clamp ring which overhangs a portion of the substrate surface above the plane of contact between the clamp ring and the substrate edge.

In another aspect of the invention, the lower tapered surface of the clamp ring aligns the substrate on the support member as the clamp ring is lifted to engage the clamp ring. Any misalignment of the substrate on the support member can be corrected by lateral movement of the substrate as the substrate comes into contact with the lower tapered surface of the clamp ring. The lower tapered surface of the clamp ring is adapted to rest on the edge of the substrate and acts as a hard stop for any material deposition beyond the diameter of this plane of contact, thereby preventing edge and backside deposition of material on the substrate.

BRIEF DESCRIPTION OF THE DRAWINGS

The above recited features and advantages of the present invention are understood with better clarity and are best understood by reference to the following detailed description when taken in conjunction with the appended drawings.

It is to be noted, however, that the appended drawings illustrate only one typical embodiment of the invention and are therefore not considered limiting of its scope, for the invention may admit to other equally affective embodiments.

DESCRIPTION OF THE PREFERRED EMBODIMENT

A clamp ring according to the present invention generally provides a tapered lower surface at its inner terminus which is adapted to contact the outer edge of a substrate to prevent deposition material from being deposited on the edge and backside of a substrate and on the adjacent surfaces of a substrate support member. The clamp ring of the invention also provides improved edge exclusion and prevents the formation of a bridging layer between the clamp ring and the substrate. The invention is useful in deposition chambers for semiconductor device manufacture, such as PVD or chemical vapor deposition (CVD) chambers. The system will be described in more detail below in a typical PVD chamber for depositing a metal film, such as copper (Cu), on a substrate. While this preferred embodiment is described as an annular member, the shape is not limiting of the scope of the invention.

Figure 1:
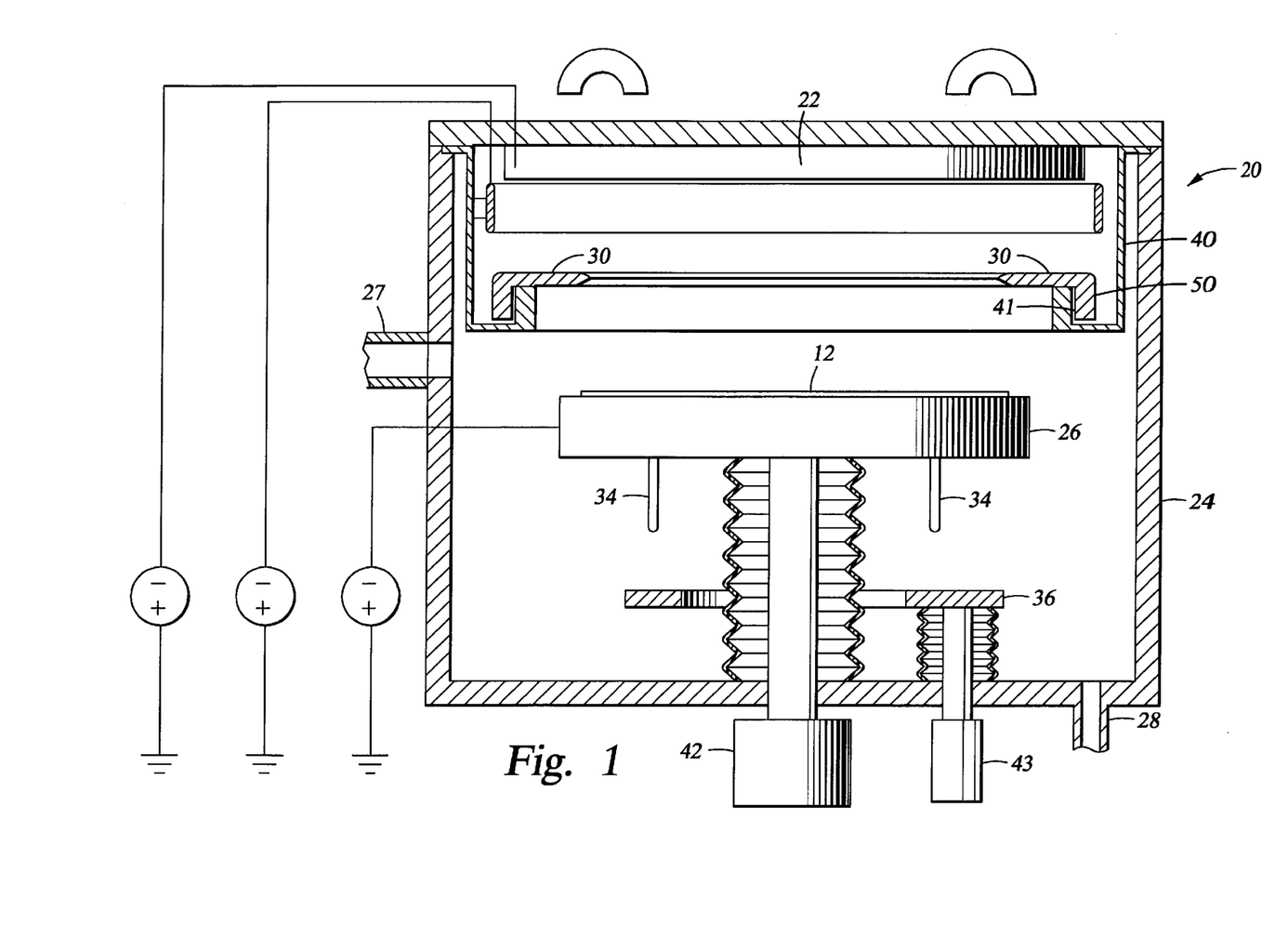
FIG. 1 is a side view, partially in section of a PVD substrate processing chamber system employing concepts of the present invention.

FIG. 1 is a simplified sectional view of a conventional PVD chamber 20 having one embodiment of a clamp ring 30 of the invention supported in the upper portion of the chamber 20. The chamber 20 generally includes a chamber enclosure wall 24 having at least one gas inlet 27 and an exhaust outlet 28 connected to a vacuum pumping system (not shown). A substrate support member 26 is disposed at the lower end of chamber and a target 22 is received at the upper end of the chamber. Target 22 is electrically isolated from the enclosure wall 24 and the enclosure wall is preferably grounded. A negative voltage is applied to the target 22 with respect to the enclosure wall 24 to generate a plasma in the chamber. A shield 40 is disposed within the chamber 20 and includes an annular upturned wall 41 on which the clamp ring 30 may be suspended over a substrate support member 26 when the support member 26 is retracted downwardly in the chamber as shown in FIG. 1.

In preparation for receiving a substrate into the chamber, the substrate support member 26 is lowered by a drive mechanism 42 to a position well below the clamp ring 30. The bottom of support member 26 approaches a pin positioning platform 36 when in its lowered position. Support member 26 includes three or more vertical bores (not shown) each of which contains a vertically slidable pin 34. When the support member 26 is in the lowered position, the bottom tip of each pin 34 rests on the platform 36, and the upper tip of each pin protrudes above the upper surface of the support member 26. The upper tips of the pins define a plane generally parallel to the upper surface of the support member 26 for receipt of a substrate to be processed.

A conventional robot arm (not shown) carries a substrate 12 into the chamber 20 and places the substrate above the upper tips of pins 34. A lift mechanism 43 moves the pin platform upwardly to place the pins against the under side of the substrate and to lift the substrate off the robot arm. The robot blade (not shown) retracts from the chamber 20 and the lift mechanism raises the support member and the pins slide downward through the support member 26 to position the substrate thereon. The lift mechanism continues to raise the support member 26 so that the periphery of the substrate contacts the inner portion of the annular clamp ring 30 which is resting on the upturned wall portion 41.

Figure 3:
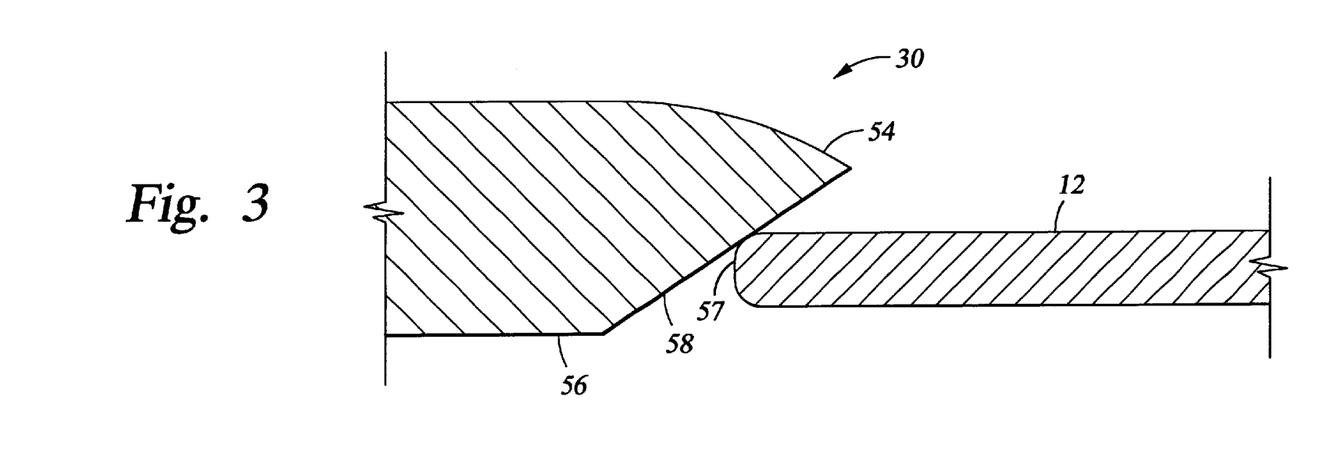
FIG. 3 is a partial cross sectional view showing one embodiment of a clamp ring of the invention.

FIG. 3 is a partial cross sectional view of one embodiment of a clamp ring 30 and the edge of a substrate 12. The clamp ring generally includes an upper roof portion 54 which extends partially over and above the upper surface of the substrate 12 to provide shielding of the contact point between the clamp ring and the edge of the substrate and an outer flange portion 50. In one embodiment, at least a portion of the lower surface of the clamp ring 30 has a generally flat tapered surface 58 to contact a substrate. Alternatively, the surface 58 may be concave or convex. The tapered surface 58 engages the beveled edge 57 or other outer edge of substrate 12 as the clamp ring 30 engages the substrate on relative movement between the substrate and the clamp ring in the chamber. The tapered surface is preferably disposed at an angle comparable to the angled edge of a substrate, generally between about 5 and 85 degrees from the longitudinal axis of the clamp ring. The tapered surface 58 is preferably disposed at an angle which would allow the clamp ring to rest at least partially on the edge of the substrate to hold the substrate in position for processing. The substrate 12 supports the clamp ring 30 as the substrate support member is moved through the clamp ring on its travel in the chamber. Preferably, the clamp ring is supported by the beveled edge of substrate 12 uniformly about its circumference and stabilizes the substrate position relative to the support member and the clamp ring. The clamp ring 30 is heavy enough to prevent the clamp ring and/or the substrate from sliding across the surface of the support member 26 once the clamp ring engages the substrate and is supported by its own weight on the substrate. As the substrate moves through the clamp ring, any lateral offset of the substrate is eliminated because the angled surface of the clamp ring urges the substrate into alignment on the support member and within the inner diameter of the clamp ring. The tapered surface of the clamp ring thereby reduces the mechanical tolerances, i.e., variations in substrate size, which must be taken into account when defining the inner diameter of the clamp ring. While the tapered surface is shown as a generally flat surface, it is contemplated by the present invention that the surface could be concave or convex.

Once clamp ring 30 is positioned on the substrate, the PVD process is started. The tapered surface 58 provides minimal surface area exclusion on the substrate during the deposition process. The tapered surface 58 also forms a solid barrier or stop to prevent vapor or particle escape from the support member 26 area during deposition. When the process is complete, the processed substrate 12 is removed from chamber 20 by a reversal of the process steps previously described.

As described previously, any premature contact between the edge 57 of a substrate 12 and the tapered edge surface 58 of clamp ring 30 of the invention as the substrate 12 is raised into processing position by the support member, results in lateral movement of the substrate 12 along the top surface of the support member into an aligned position. This aligning movement can continue until the opposite side of the tapered edge 58 also contacts the opposite side bevel edge 57 of the substrate 12. Thus, the clamp ring 30 of the invention is self aligning with the substrate 12.

Figure 4:
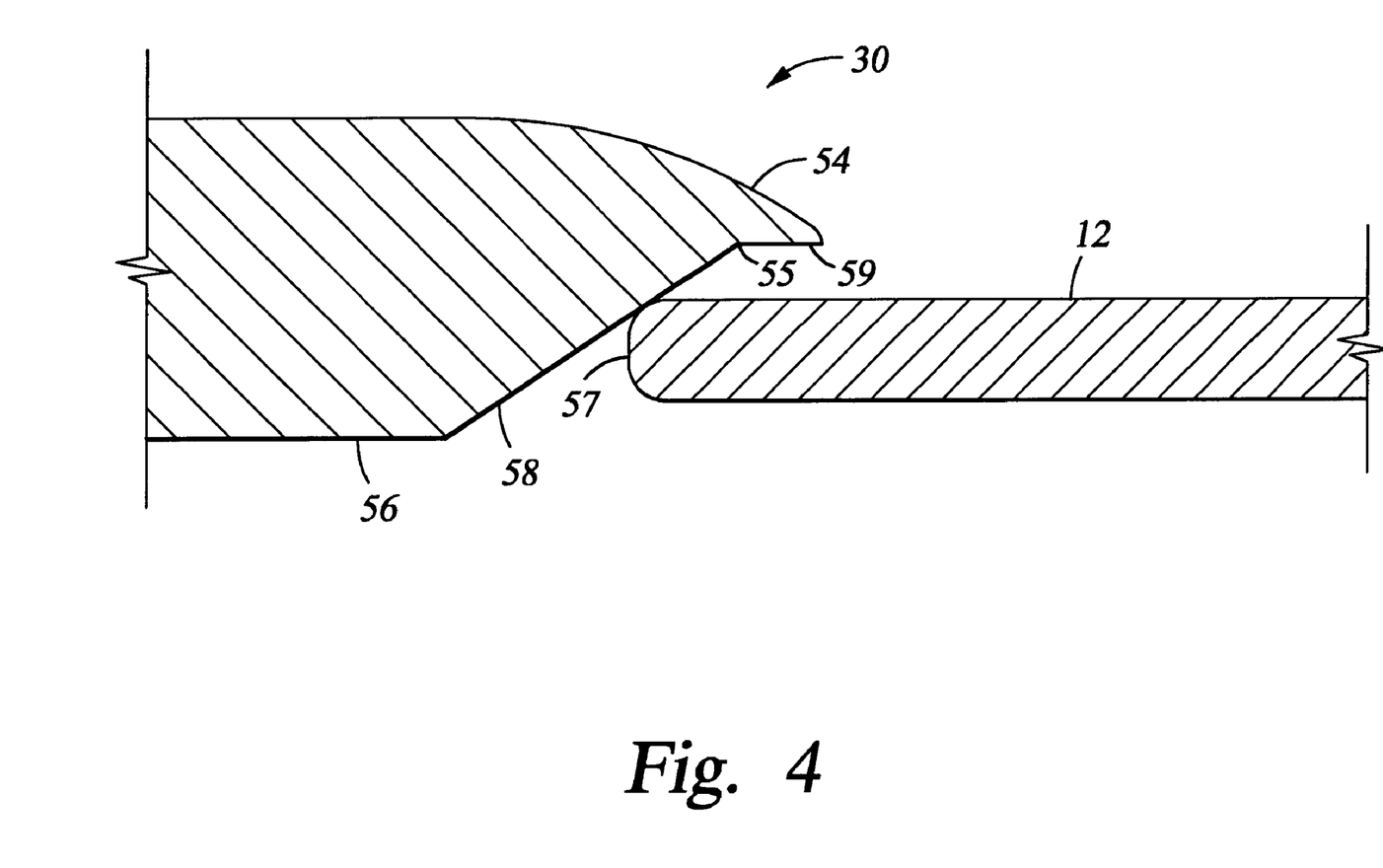
FIG. 4 is a partial sectional view of an another embodiment of the invention.
Figure 5:
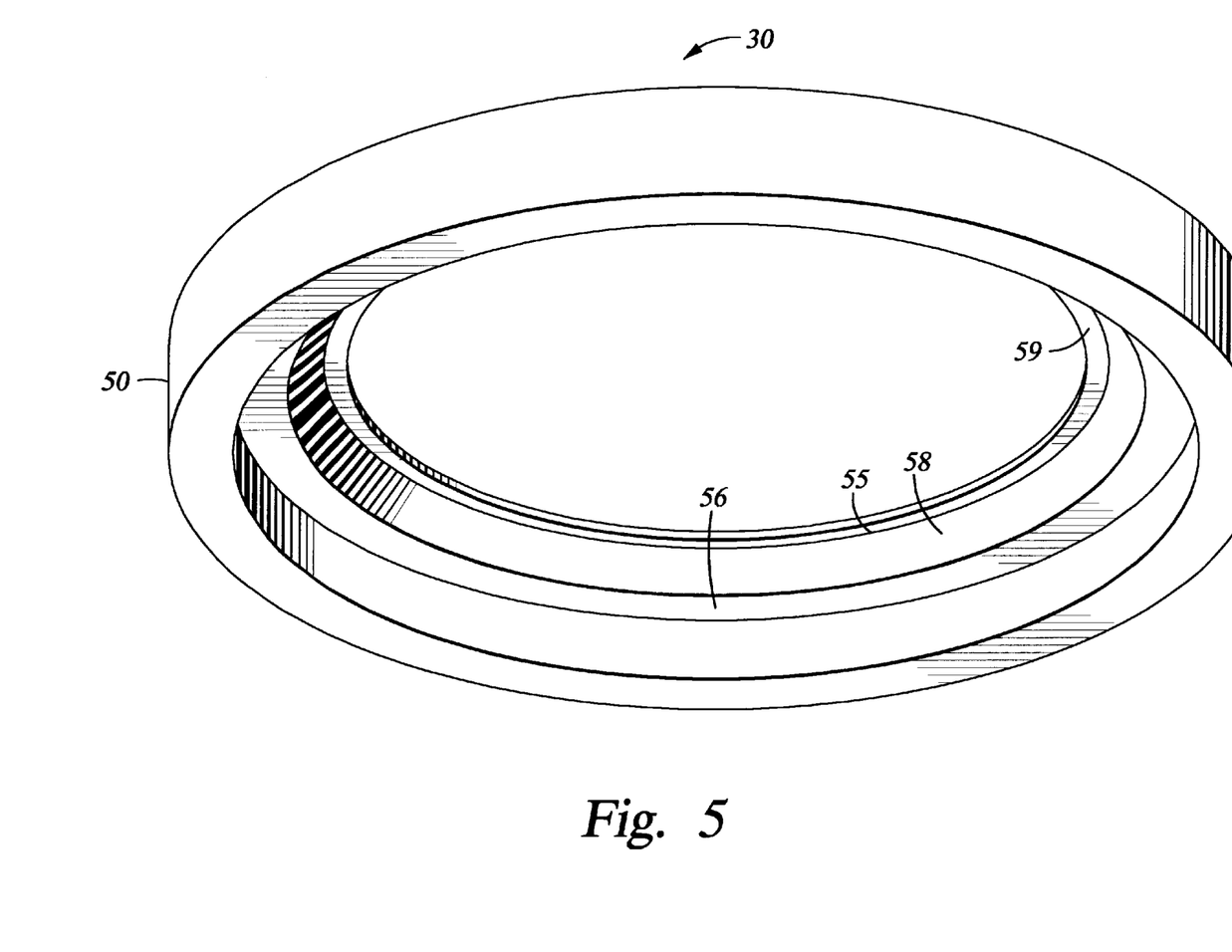
FIG. 5 is a substantially bottom perspective view of a clamp ring of the invention.

FIG. 4 shows an alternative embodiment of a clamp ring of the invention. The lower surface of the clamp ring may include an angled recess 55 which defines a generally flat tapered surface 58 and a generally flat lower roof surface 59 disposed over the substrate in a manner generally parallel to the upper surface of a substrate disposed on the support member 26 which provides a roof aspect ratio which can be proportioned to provide good edge exclusion while also preventing sticking of the clamp ring to the substrate. A tapered seating surface 58 is provided to contact the edge of the substrate similar to the embodiment shown in FIG. 3. However; the plane of the roof portion disposed inwardly of the seating portion is generally disposed parallel with the substrate surface. A roof aspect ratio (height:width) can be selected to minimize edge exclusion and/or deposition at the contact area between the clamp ring and the substrate. In addition, the generally parallel lower surface could be stepped to provide an effective roof aspect ratio which is greater than a generally planar lower surface. FIG. 5 is a substantially bottom perspective view of the clamp ring showing the tapered surface 58 and the lower roof surface 59 which define the angled recess 55.

The clamp ring is preferably made of a compatible material such as aluminum, ceramics such as aluminum oxide or alumina, quartz, and the like. Other materials may be known or become known in the art and may be used as well.

The clamp ring of the present invention may be used in PVD, CVD, etch or any other processing system to improve edge exclusion. Such systems typically include a chamber and a substrate support pedestal which lifts a substrate vertically to engage a clamp ring in accordance with the concepts of the invention. Once engaged, the clamp ring seals the bevel edge surface of the substrate and maintains the position of the substrate during processing.

While the forgoing is directed to the preferred embodiment of the invention, other and further embodiments of the invention may be devised without departing from the basic scope thereof. The scope of the invention is determined by the claims which follow.

What is claimed is:

1. A system for processing substrates, comprising:
  a) a vacuum enclosure;
  b) a substrate support member disposed in the enclosure; and
  c) a clamp ring having a tapered substrate contact surface at a first diameter and a roof surface at a second diameter less than the first diameter and less than an outer diameter of a substrate disposable on the substrate support member so that the roof surface remains in a spaced relationship with an upper surface of the substrate when the substrate is aligned and clamped.

2. The system of claim 1 wherein a lower portion of the roof surface is disposed substantially parallel to an upper surface of the substrate support member.

3. The system of claim 1 wherein the substrate contact surface is disposed at an angle relative to an upper surface of the substrate support member.

4. The system of claim 3 wherein the substrate contact surface is a continuous, generally smooth annular shaped surface.

5. The system of claim 4 wherein the substrate contact surface forms an annular seal with the substrate.

6. The system of claim 3 wherein the substrate contact surface is generally convex.

7. The system of claim 1 wherein the substrate contact surface is adapted to clamp a beveled edge of the substrate.

8. The system of claim 1 wherein the first diameter of the substrate contact surface is substantially equal the outer diameter of the substrate.

9. The system of claim 1, wherein the substrate contact surface comprises a substrate alignment surface and a substrate clamping surface.

10. An apparatus for securing a substrate on a substrate support member, comprising:
  a frame having a roof portion, an outer base portion and a substrate clamping surface extending at least partially between the roof portion and the base portion, the substrate clamping surface being tapered and disposed at an angle relative to a longitudinal axis of the frame, wherein the roof portion is adapted to be disposed in spaced relationship when the substrate is aligned and contacts the substrate clamping surface.

11. The apparatus of claim 10 wherein the substrate clamping surface comprises a generally smooth tapered surface and the frame comprises a generally annular shape.

12. The apparatus of claim 11 wherein the tapered surface comprises a continuous, generally annular shaped surface.

13. The apparatus of claim 10 wherein a lower portion of the roof portion is disposed at an angle relative to the substrate clamping surface.

14. The apparatus of claim 10 wherein the base further comprises an outer flange.

15. The apparatus of claim 10 further comprising a substrate contact surface between the roof portion and the outer base portion, wherein the substrate contact surface includes the substrate clamping surface and a substrate alignment surface.

16. The apparatus of claim 10 wherein the substrate clamping surface is adapted to clamp a beveled edge of the substrate.

17. An apparatus for securing a substrate on a substrate support member, comprising:
  a substantially unitary frame having:
    a roof portion;
    an outer base portion; and
    a substrate contact surface extending at least partially between the roof portion and the base portion, comprising:
      a substrate alignment surface; and
      a substrate clamping surface;
    wherein the roof portion is adapted to remain in a spaced relationship with an upper surface of the substrate when the substrate is aligned by the alignment surface and clamped by the clamping surface.

18. The apparatus of claim 17 wherein the substrate contact surface comprises a generally continuous tapered surface and the frame comprises a generally annular shape.

19. The apparatus of claim 18 wherein the roof portion is disposed at an angle relative to the substrate contact surface.

20. The apparatus of claim 17 wherein the substrate contact surface is disposed at an angle relative to a longitudinal axis of the frame.

21. The apparatus of claim 17 wherein the substrate contact surface has a tapered seat adapted to secure the substrate to a support member uniformly around the perimeter of the substrate surface.

22. The apparatus of claim 17 wherein the substrate contact surface and the roof portion form a continuous annular surface disposed on a common plane.

23. The apparatus of claim 17 wherein the substrate contact surface and the roof portion comprise a generally continuous tapered surface and the frame comprises a generally annular shape.

* * * * *

UNITED STATES PATENT AND TRADEMARK OFFICE
CERTIFICATE OF CORRECTION

PATENT NO.     : 6,277,198 B1                                                Page 1 of 1
DATED          : August 21, 2001
INVENTOR(S)    : Yao et al.

It is certified that error appears in the above-identified patent and that said Letters Patent is hereby corrected as shown below:

<u>Column 6,</u>
Lines 7-8, please delete "an upper surface of"

Signed and Sealed this

Eighteenth Day of June, 2002

Attest:

Attesting Officer

JAMES E. ROGAN
*Director of the United States Patent and Trademark Office*